(12) United States Patent
Lassa et al.

(10) Patent No.: US 8,700,961 B2
(45) Date of Patent: Apr. 15, 2014

(54) CONTROLLER AND METHOD FOR VIRTUAL LUN ASSIGNMENT FOR IMPROVED MEMORY BANK MAPPING

(75) Inventors: Paul A. Lassa, Cupertino, CA (US); Alan W. Sinclair, Falkirk (GB)

(73) Assignee: SanDisk Technologies Inc., Plano, TX (US)

( * ) Notice: Subject to any disclaimer, the term of this patent is extended or adjusted under 35 U.S.C. 154(b) by 115 days.

(21) Appl. No.: 13/330,975

(22) Filed: Dec. 20, 2011

(65) Prior Publication Data

US 2013/0159601 A1  Jun. 20, 2013

(51) Int. Cl.
G11C 29/00 (2006.01)

(52) U.S. Cl.
USPC ............................ 714/710; 714/721; 714/746

(58) Field of Classification Search
USPC .................. 714/710, 721, 773, 780, 746, 799
See application file for complete search history.

(56) References Cited

U.S. PATENT DOCUMENTS

| | | | |
|---|---|---|---|
| 4,757,506 A * | 7/1988 | Heichler | 714/795 |
| 5,822,256 A | 10/1998 | Bauer et al. | |
| 7,171,536 B2 | 1/2007 | Chang et al. | |
| 7,231,585 B2 | 6/2007 | Vainsencher et al. | |
| 7,366,029 B2 | 4/2008 | Kagan | |
| 7,631,245 B2 | 12/2009 | Lasser | |
| 8,365,030 B1 * | 1/2013 | Choi et al. | 714/746 |
| 8,479,083 B2 * | 7/2013 | Chae et al. | 714/780 |
| 2005/0144516 A1 | 6/2005 | Gonzalez et al. | |
| 2009/0228637 A1 | 9/2009 | Moon et al. | |
| 2009/0240873 A1 | 9/2009 | Yu et al. | |
| 2009/0271562 A1 | 10/2009 | Sinclair | |
| 2010/0023800 A1 | 1/2010 | Harari et al. | |
| 2010/0057979 A1 | 3/2010 | Chu et al. | |
| 2011/0040924 A1 | 2/2011 | Selinger | |
| 2011/0041005 A1 | 2/2011 | Selinger | |
| 2011/0041039 A1 | 2/2011 | Harari et al. | |
| 2011/0161554 A1 | 6/2011 | Selinger et al. | |
| 2011/0161784 A1 | 6/2011 | Selinger et al. | |

* cited by examiner

Primary Examiner — Fritz Alphonse
(74) Attorney, Agent, or Firm — Brinks Gilson & Lione

(57) ABSTRACT

A controller communicates with a plurality of multi-chip memory packages. Each multi-chip memory package comprises a plurality of memory dies, each having a respective plurality of memory blocks, some of which are good and some of which are bad. The controller determines a number of good blocks in each memory die. Based on the determined number of good blocks in each memory die, the controller selects a memory die from each of the multi-chip memory packages to access in parallel, wherein the selected memory dies are not necessarily all in the same relative position in each multi-chip package. The controller then creates a metablock from a set of good blocks from each of the selected memory dies, wherein a maximum number of metablocks that can be created across the selected memory dies is determined by a lowest number of good blocks in the selected memory dies.

20 Claims, 10 Drawing Sheets

CONTROLLER AND METHOD FOR VIRTUAL LUN ASSIGNMENT FOR IMPROVED MEMORY BANK MAPPING

BACKGROUND

A solid state drive (SSD) is designed to provide reliable and high performance storage of user data across a flash-based memory system containing a host interface controller (such as a Serial Advanced Technology Attachment (SATA)) interface) and a number of memory multi-chip packages (MCPs), where each MCP contains a stack of NAND flash dies and, optionally, a flash memory controller. The Open NAND Flash Interface (ONFI) protocol provides support for parallel access to multiple NAND dies (or "logical units" (LUNs)) on a single "target" or NAND multi-chip stack on a single shared ONFI channel. In a typical SATA-based SSD application, a central host controller accesses multiple attached devices (targets/NAND device clusters) on each ONFI channel, and across several ONFI channels. (A typical host controller would include a SATA interface and four, eight, or more flash interface channels. These channels may utilize a standard flash interface protocol, such as ONFI.) Each ONFI target typically controls 2, 4, or 8 NAND dies. Storage management software running on the host controller manages a virtual memory space that is mapped to flash blocks in the physical dies in each of the attached MCP's. The host controller and the storage management software utilize parallel access and efficient usage of the available flash devices to optimize SSD drive performance, endurance, and cost.

SUMMARY

The present invention is defined by the claims, and nothing in this section should be taken as a limitation on those claims.

By way of introduction, the embodiments described below provide a controller and method for virtual logical unit (LUN) assignment for improved memory bank mapping. In one embodiment, a controller is presented having one or more interfaces through which to communicate with a plurality of multi-chip memory packages. Each multi-chip memory package comprises a plurality of memory dies, and each memory die has a respective plurality of memory blocks, some of which are good blocks and some of which are bad blocks. The controller determines a number of good blocks in each memory die in each of the multi-chip memory packages. Based on the determined number of good blocks in each memory die, the controller selects a memory die from each of the multi-chip memory packages to access in parallel, wherein the selected memory dies are not necessarily all in the same relative position in each multi-chip package. The controller then creates a metablock from a set of good blocks from each of the selected memory dies, wherein a maximum number of metablocks that can be created across the selected memory dies is determined by a lowest number of good blocks in the selected memory dies.

Other embodiments are disclosed, and each of the embodiments can be used alone or together in combination. The embodiments will now be described with reference to the attached drawings.

DETAILED DESCRIPTION OF THE PRESENTLY PREFERRED EMBODIMENTS

Introduction

The following embodiments relate generally to a controller and method for virtual logical unit (LUN) (i.e., memory die) assignment for improved memory bank mapping. As was discussed above, storage management software running on a host controller can manage a virtual memory space that is mapped to flash blocks in the physical dies of multi-chip packages in order to provide parallel access and efficient usage of the memory. To provide such parallelism, metablocks can be formed from blocks in a given memory die position across several multi-chip packages. However, the presence of bad blocks in the memory dies can limit the number of metablocks that can be created across multi-chip packages. The following embodiments can be used to determine the number of good blocks in each memory die and, based on that determination, select which memory dies within each MCP to use to create optimal metablocks. By forming metablocks based on a deliberate selection of memory dies rather than based on a predetermined selection that does not take into account the number of bad blocks in the memory dies, these embodiments can result in better performance.

Before turning to details of these embodiments, the following section discusses exemplary architectures.

Exemplary Architectures

Figure 1:
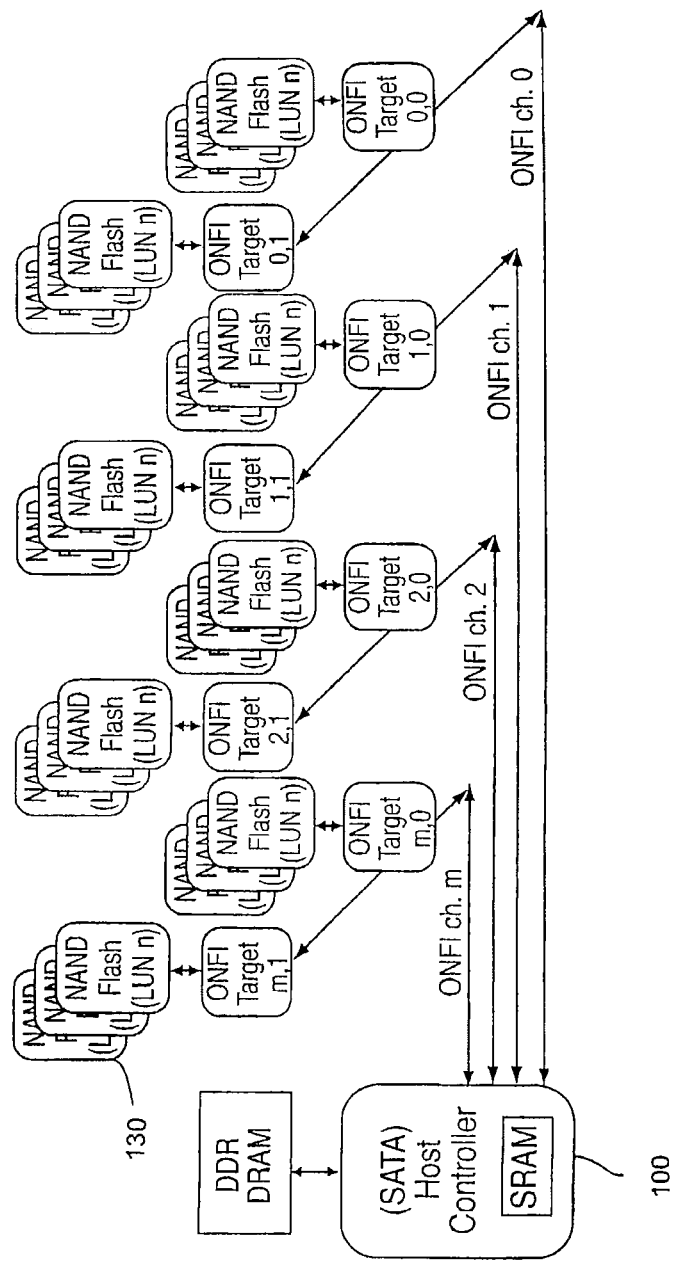
FIG. 1 is a block diagram of a memory system of an embodiment.

Turning now to the drawings, FIG. 1 is a block diagram of a memory system of an embodiment. As shown in FIG. 1, a host controller 100 is in communication with a plurality of multi-chip memory packages via one or more interfaces (here, ONFI channels). (As used herein, the phrase "in communication with" means directly in communication with or indirectly in communication with through one or more components, which may or may not be shown or described herein.) Here, the controller 100 accesses (on each ONFI channel and across several ONFI channels) multiple attached ONFI targets. Each multi-chip memory package (called a "target" in FIG. 1) comprises a plurality of memory dies (NAND Flash LUNs) and, optionally, a local MCP controller (not shown). The controller 100 also has a processor configured to perform various actions, which will be described in detail below. The controller 100 can have on-board memory (e.g., SRAM) and/or external memory (e.g., DDR DRAM) to store executable program code (software or firmware) and other user data and system control data or structures used in its operations. In one embodiment, the memory system is part of a solid-state drive (SSD), and, in another embodiment, the controller 100 is used in OEM designs that use a Southbridge controller to interface to flash memory devices. Of course, these are merely examples, and other implementations can be used.

As mentioned above, controller 100 is a host controller. A "host" is any entity that is capable of accessing the one or more flash memory device(s) through the controller 100, either directly or indirectly through one or more components named or unnamed herein. A host can take any suitable form, such as, but not limited to, a personal computer, a mobile phone, a game device, a personal digital assistant (PDA), an email/text messaging device, a digital camera, a digital media (e.g., MP3) player, a GPS navigation device, a personal navigation system (PND), a mobile Internet device (MID), and a TV system. Depending on the application, the host can take the form of a hardware device, a software application, or a combination of hardware and software.

Also, "flash memory device(s)" refer to device(s) containing a plurality of flash memory cells and any necessary control circuitry for storing data within the flash memory cells. In one embodiment, the flash memory cells are NAND memory cells, although other memory technologies, such as passive element arrays, including one-time programmable memory elements and/or rewritable memory elements, can be used. (It should be noted that, in these embodiments, a non-NAND-type flash memory device can still use a NAND interface and/or NAND commands and protocols.) Also, a flash memory device can be a single memory die or multiple memory dies. Accordingly, the phrase "a flash memory device" used in the claims can refer to only one flash memory device or more than one flash memory device.

Figure 2:
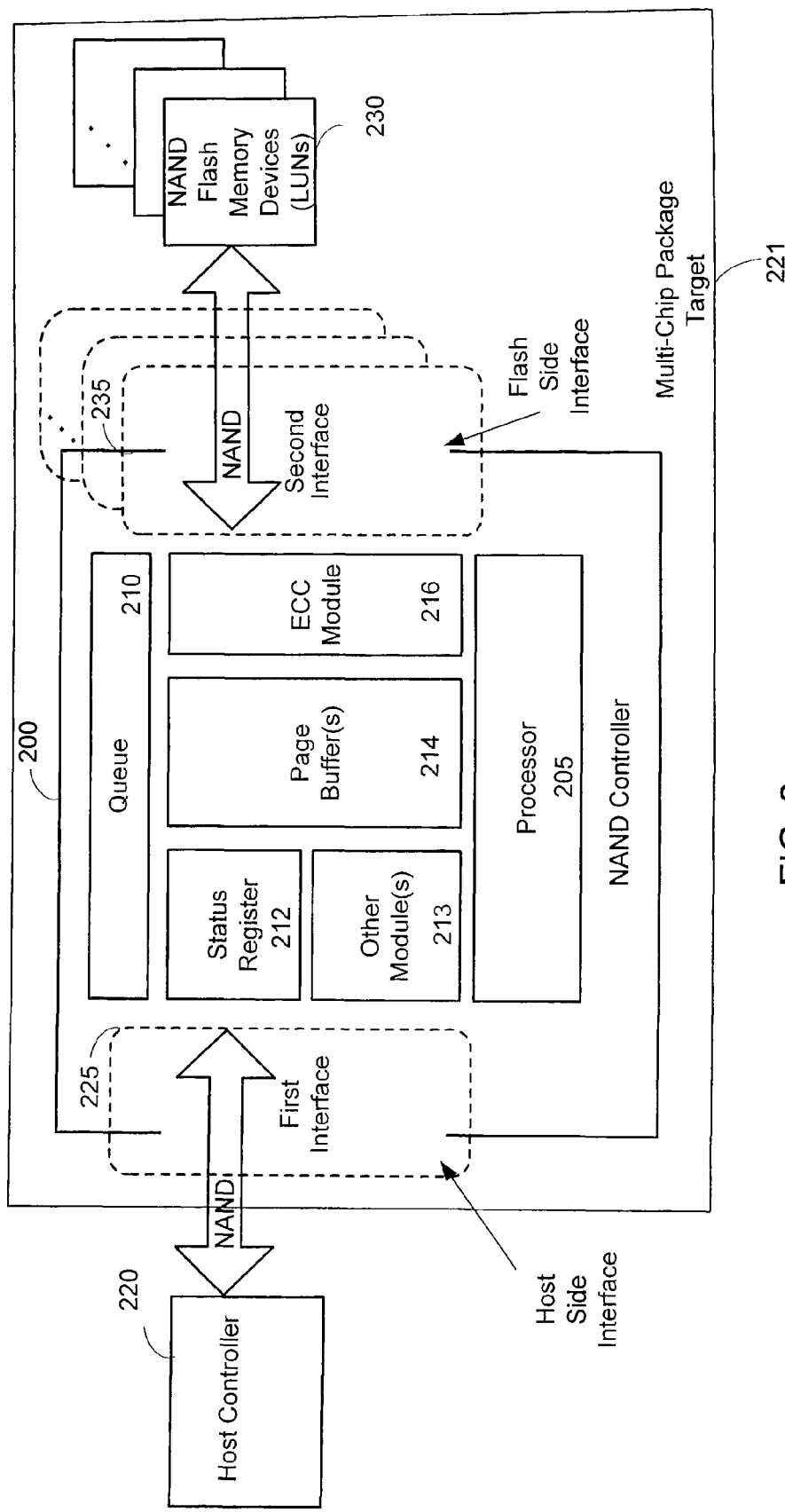
FIG. 2 is a block diagram of a multi-chip package of an embodiment.

Returning to the drawings, FIG. 2 illustrates a "target" multi-chip package 221 and a host controller 220 of an embodiment. As shown in FIG. 2, the multi-chip package 221 has a NAND controller 200 having a processor 205, a queue (memory) 210, one or more status registers 212, one or more other module(s) 213, one or more page buffers 214, and an error correction code (ECC) module 216. (The NAND controller 200 can contain other components, which are not shown in FIG. 2 to simplify the drawing.) As used herein, a "module" can include hardware, software, firmware, or any combination thereof. Examples of forms that a "module" can take include, but are not limited to, one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The "other module(s) 213" can perform any desired function(s), such as, but not limited to, data scrambling, column replacement, handling write aborts and/or program failures (via safe zones), read scrubbing, wear leveling, bad block and/or spare block management, error detection code (EDC) functionality, status functionality, encryption functionality, error recovery, and address mapping (e.g., mapping of logical to physical blocks). Further information about these various functions is described in U.S. patent application Ser. Nos. 12/539,394; 12/539,407; 12/539,379; 12/650,263; 12/650,255; and 12/539,417, which are hereby incorporated by reference.

While the NAND controller 200 and flash memory device(s) 230 are shown as two separate boxes, it should be understood that the NAND controller 200 and flash memory device(s) 230 can be arranged in any suitable manner (e.g., packaged in different packages, packaged within a common multi-chip package, and or integrated on a same die). In any of these arrangements, the controller can be physically located separately from the host controller 220. This allows the controller and flash memory device(s) to be considered a separate circuitry unit, which can be used with a wide variety of host controllers 220.

The NAND controller 200 communicates with the host controller 220 using a first interface 225 and communicates with the flash memory device(s) 230 using second interface(s) 235. The first and second interfaces can be NAND interfaces operating under NAND interface protocols. Examples of NAND interfaces include, but are not limited to, Open NAND Flash Interface (ONFI), toggle mode (TM), and a high-performance flash memory interface, such as the one described in U.S. Pat. No. 7,366,029, which is hereby incorporated by reference. The NAND controller 200 may optionally include one or more additional host-side interfaces, for interfacing the NAND controller 200 to hosts using non-NAND interfaces, such as SD, USB, SATA, or MMC interfaces. Also, the interfaces 225, 235 can use the same or different NAND interface protocols.

In general, a NAND interface protocol is used to coordinate commands and data transfers between a NAND flash device and a host using, for example, data lines and control signals, such as ALE (Address Latch Enable), CLE (Command Latch Enable), and WE# (Write Enable). Even though the term "NAND interface protocol" has not, to date, been formally standardized by a standardization body, the manufacturers of NAND flash devices all follow very similar protocols for supporting the basic subset of NAND flash functionality. This is done so that customers using NAND devices within their electronic products could use NAND devices from any manufacturer without having to tailor their hardware or software for operating with the devices of a specific vendor. It is noted that even NAND vendors that provide extra functionality beyond this basic subset of functionality ensure that the basic functionality is provided in order to provide compatibility with the protocol used by the other vendors, at least to some extent.

A given device (e.g., a controller, a flash memory device, a host, etc.) is said to comprise, include, or have a "NAND interface" if the given device includes elements (e.g., hardware, software, firmware, or any combination thereof) necessary for supporting the NAND interface protocol (e.g., for interacting with another device using a NAND interface protocol). (As used herein, the term "interface(s)" can refer to a single interface or multiple interfaces. Accordingly, the term "interface" in the claims can refer to only one interface or more than one interface.) In this application, the term "NAND Interface protocol" (or "NAND interface" in short) refers to an interface protocol between an initiating device and a responding device that, in general, follows the protocol between a host and a NAND flash device for the basic read, write, and erase operations, even if it is not fully compatible with all timing parameters, not fully compatible with respect to other commands supported by NAND devices, or contains additional commands not supported by NAND devices. One suitable example of a NAND interface protocol is an interface protocol that uses sequences of transferred bytes equivalent in functionality to the sequences of bytes used when interfacing with a Toshiba TC58NVG1S3B NAND device (or a Toshiba TC58NVG2D4B NAND device) for reading (opcode 00H), writing (opcode 80H), and erasing (opcode 60H), and also uses control signals equivalent in functionality to the CLE, ALE, CE, WE, and RE signals of the above NAND device.

It is noted that a NAND interface protocol is not symmetric in that the host—not the flash device—initiates the interaction over a NAND interface. Further, an interface (e.g., a NAND interface or an interface associated with another protocol) of a given device (e.g., a controller) may be a "host-side interface" (e.g., the given device is adapted to interact with a host using the host-side interface), or the interface of the given device may be a "flash memory device-side interface" (e.g., the given device is adapted to interact with a flash memory device using the flash memory device-side interface). The terms "flash memory device-side interface," "flash device-side interface," and "flash-side interface" are used interchangeably herein.

These terms (i.e., "host-side interface" and "flash device-side interface") should not be confused with the terms "host-type interface" and "flash-type interface," which are terminology used herein to differentiate between the two sides of a NAND interface protocol, as this protocol is not symmetric. Furthermore, because it is the host that initiates the interaction, we note that a given device is said to have a "host-type interface" if the device includes the necessary hardware and/or software for implementing the host side of the NAND interface protocol (i.e., for presenting a NAND host and initiating the NAND protocol interaction). Similarly, because the flash device does not initiate the interaction, we note that a given device is said to have a "flash-type interface" if the device includes the necessary hardware and/or software for implementing the flash side of the NAND protocol (i.e., for presenting a NAND flash device).

Typically, "host-type interfaces" (i.e., those which play the role of the host) are "flash device-side interfaces" (i.e., they interact with flash devices or with hardware emulating a flash device) while "flash device-type interfaces" (i.e., those which play the role of the flash device) are typically "host-side interfaces" (i.e., they interact with hosts or with hardware emulating a host).

Additional information about exemplary controllers (and their advantages over prior controllers) can be found in U.S. Pat. No. 7,631,245 and U.S. patent application Ser. Nos. 12/539,394; 12/539,407; 12/539,379; 12/650,263; 12/650,255; and 12/539,417, which are hereby incorporated by reference.

Figure 3:
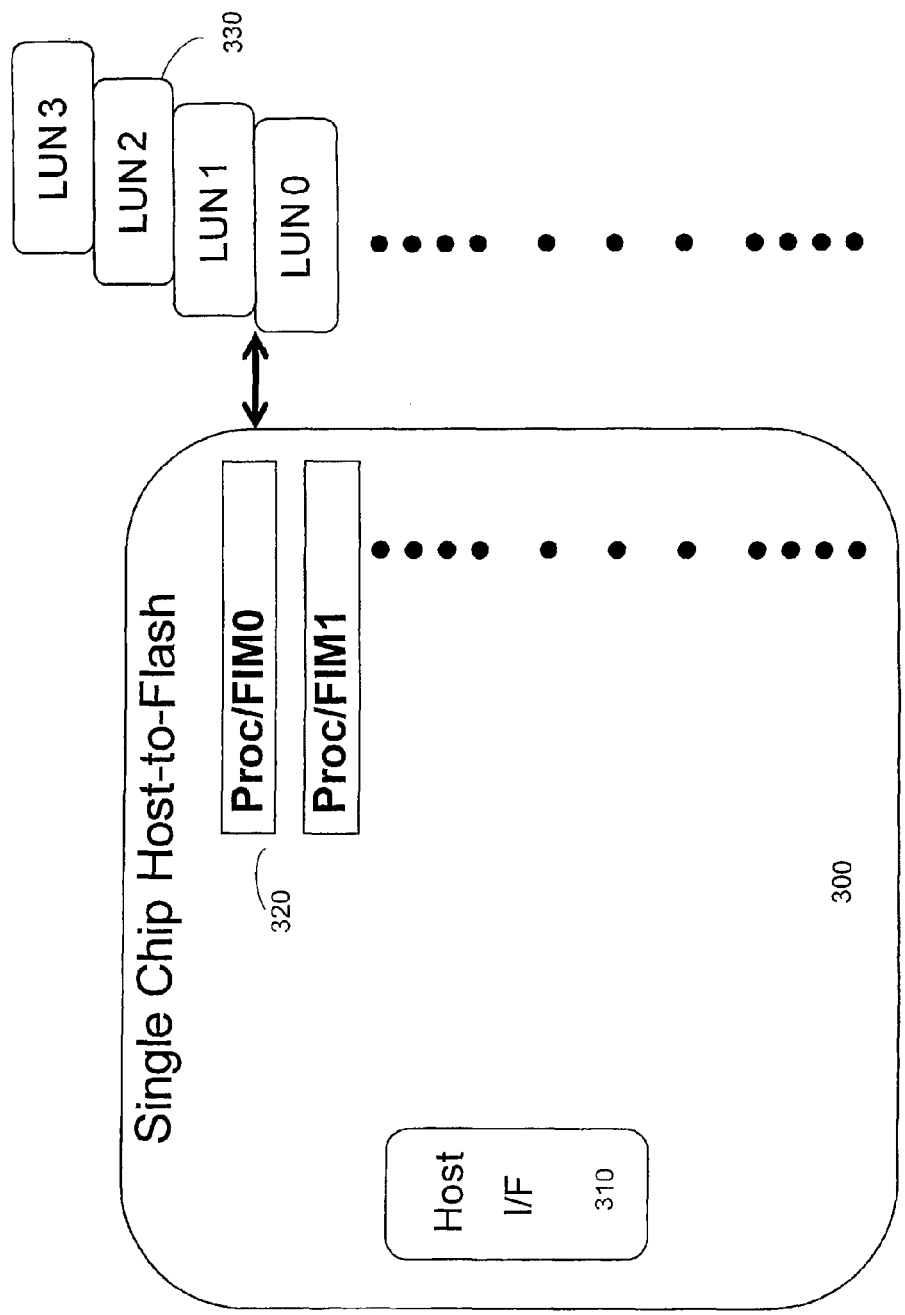
FIG. 3 is a block diagram of an architecture of an embodiment.
Figure 4:
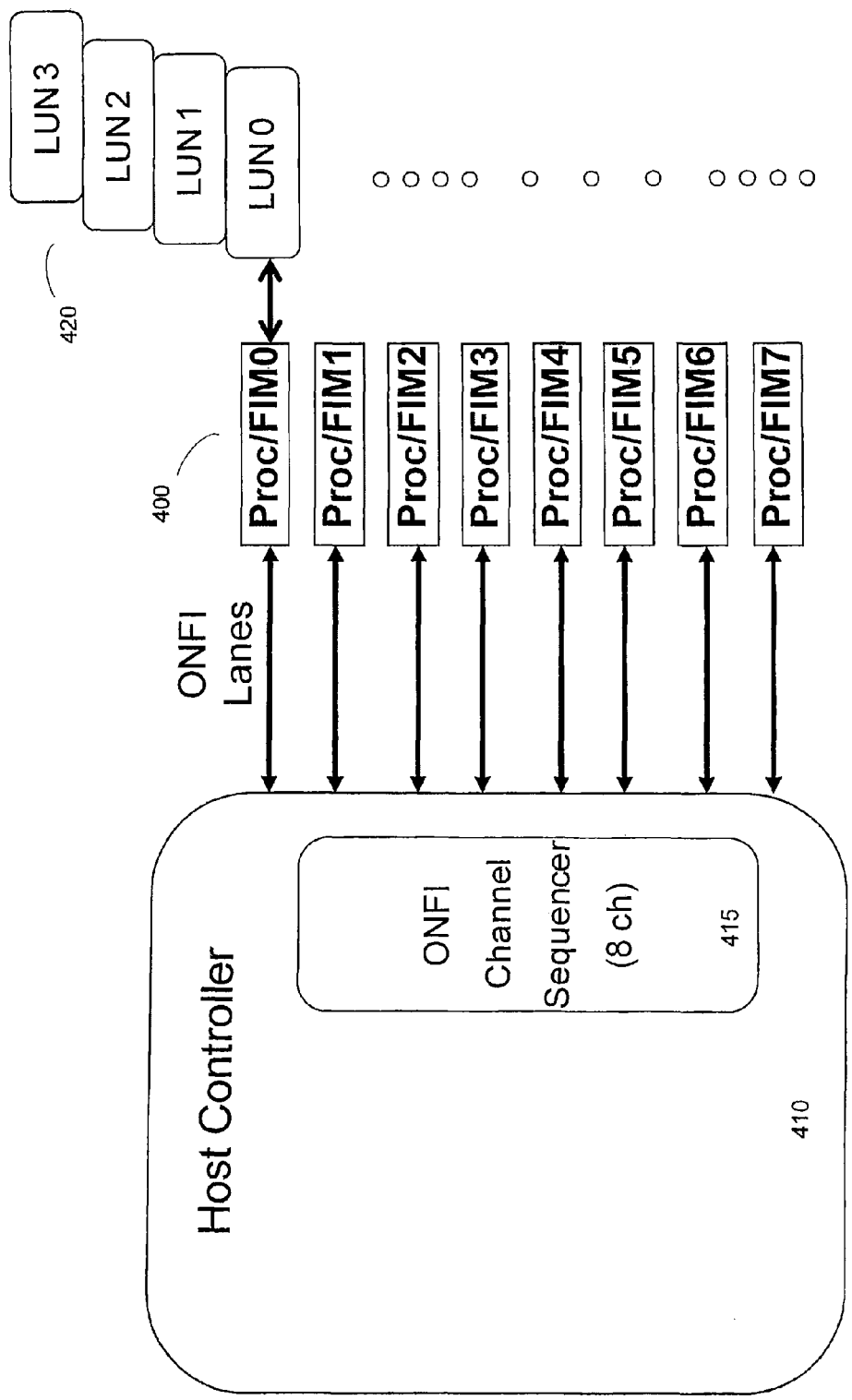
FIG. 4 is a block diagram of an architecture of an embodiment.
Figure 5:
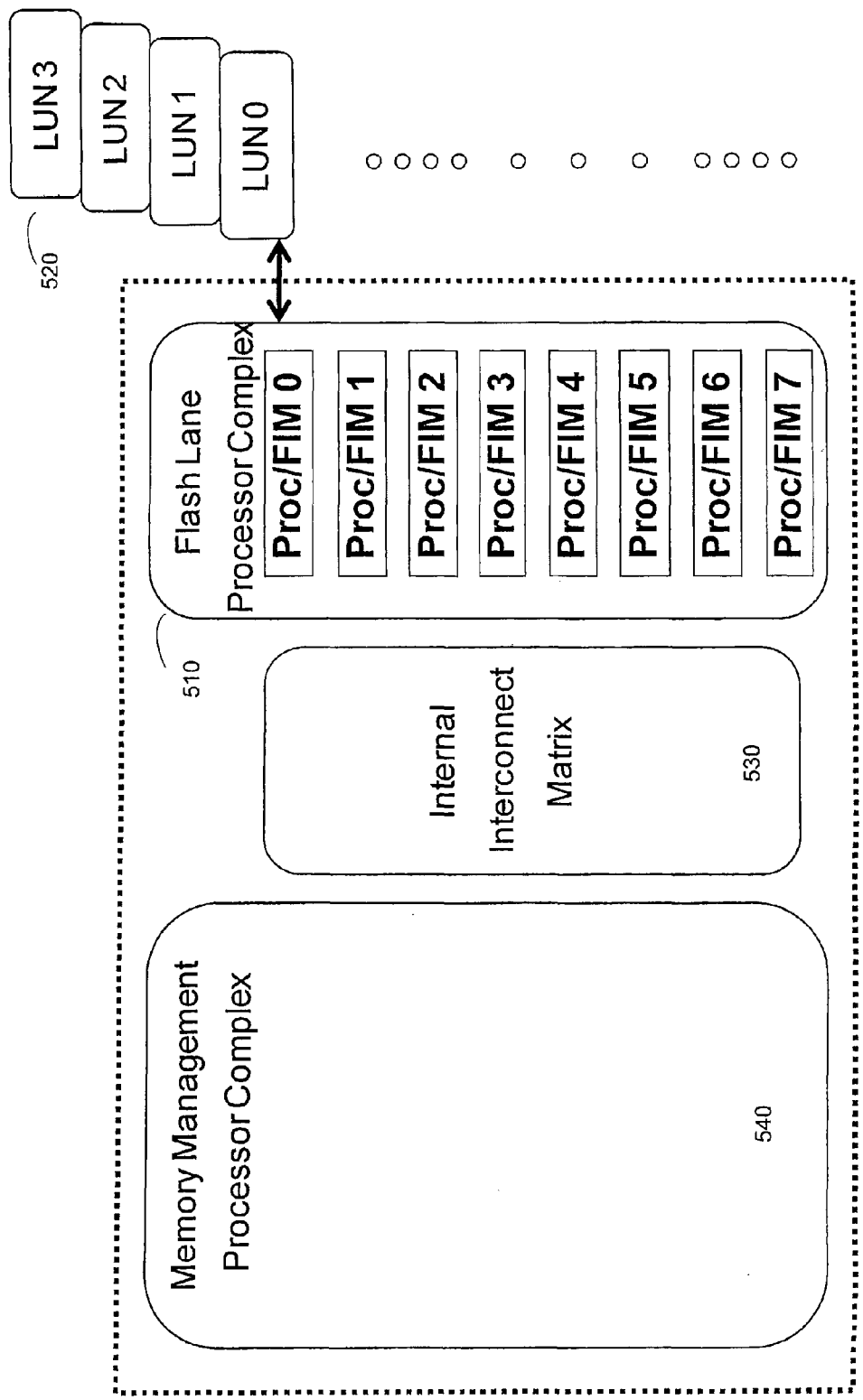
FIG. 5 is a block diagram of an architecture of an embodiment.

It should also be noted that other controller architectures can be used. For example, FIG. 3 illustrates a single chip host-to-flash controller 300. This controller 300 contains a host interface 310 and a plurality of processor/flash interface modules (FIMs) 320. Each of the processor/FIMs is connected to a respective plurality of flash memory devices (LUNs). In another embodiment (shown in FIG. 4), instead of the plurality of processor/FIMs being inside a single controller, each processor/FIM 400 communicates individually with an ONFI channel sequencer 415 in the host controller via respective ONFI lanes. As in FIG. 3, each processor/FIM 400 in this embodiment is connected to a plurality of flash memory devices (LUNs) 420. In yet another embodiment (shown in FIG. 5), the controller contains a flash lane processor complex 510 that contains a plurality of processor/FIMs connected to a plurality of flash memory devices (LUNs) 520. The flash lane processor complex 525 is connected via an internal interconnect matrix 530 to a memory management processor complex 540, that manages the operation of the memory. Of course, these are just examples of some of the architectures that can be used; others can be used. The claims should not be limited to a particular type of architecture unless explicitly recited therein.

The three example architectures above illustrate the variations on how a host platform (PC, laptop, etc.), host interface controller (such as SATA, PCIe, etc.), or simply one or more host processes or execution threads within an integrated storage complex or SOC may produce a plurality of memory storage, memory management, or device maintenance or health operations destined for one or more exemplary Flash Memory controller Lanes, processes, or execution threads.

Now that exemplary controller architectures have been described, the following section provides more information about the embodiments related to virtual LUN assignment for improved memory bank mapping.

Embodiments Relating to Virtual LUN Assignment for Improved Memory Bank Mapping

As mentioned above, storage management software running on a host controller can manage a virtual memory space that is mapped to flash blocks in the physical dies of multi-chip packages in order to provide parallel access and efficient mapping, usage, and compaction of the available blocks in the memories to achieve optimal solid-state drive performance. To provide such parallelism, a metablock can be formed from blocks in a given memory die position across the multi-chip package. Efficient software handling of data on these metablocks is often achieved if the metablocks are made up of a regular, power-of-two number of blocks. In the memory system shown in FIG. 1, storage management software may achieve optimal workload performance by striping metablocks such that they access one or two LUNs across four or eight ONFI channels. Preferably, a metablock is formed from "good" blocks (i.e., blocks with no errors or a number of errors below a threshold amount). Accordingly, the number of metablocks formed on multiple multi-chip packages, LUNs, or planes is determined by the distribution of good blocks across the dies and ONFI channels comprising the metablock (after mapping out "bad" (defective) blocks).

While process and material defect management is an important component of flash mass production, a small number of defects are usually unavoidable. Flash memory dies are assembled into multi-chip "stacks" and are tested at manufacturing time. Usually, each NAND die (1, 2, 4, 8) in the multi-chip package is tested, and each plane (1, 2, 4, etc.) on each die is tested. Flash memory yield (whether a die is good or must be discarded) is determined by the number of good or usable blocks in each plane of the device. The manufacturing process screens for the number of defective or bad blocks. The number of bad blocks per die/per plane typically varies between 0 and 100 blocks. Good block testing is typically done after one, two, four, or eight die are already stacked/assembled in an MCP package.

Each NAND device is designed with an excess of the absolute minimum number of blocks required in the application, such that a device may have defective blocks up to this count and still be shipped as a usable memory device. A typical flash device used in an solid-state drive application may require perhaps 2,000 good blocks, so it is designed to provide perhaps 2,100 good blocks on the die, with an allowance for perhaps up to 100 blocks to contain manufacturing defects, or to become defective (through program failure) over the life of the product. Given the semi-random distribution of defects across various die on a wafer, each specific die may be found to have between 0 and 100 bad blocks. If it has more than 100, or is too close to the limit at manufacturing time, the device is discarded. However, the number of bad blocks in a given memory die may not be apparent until the memory dies are assembled in the multi-chip package, in which case, there may be more bad blocks than desired on a given die.

Figure 6:
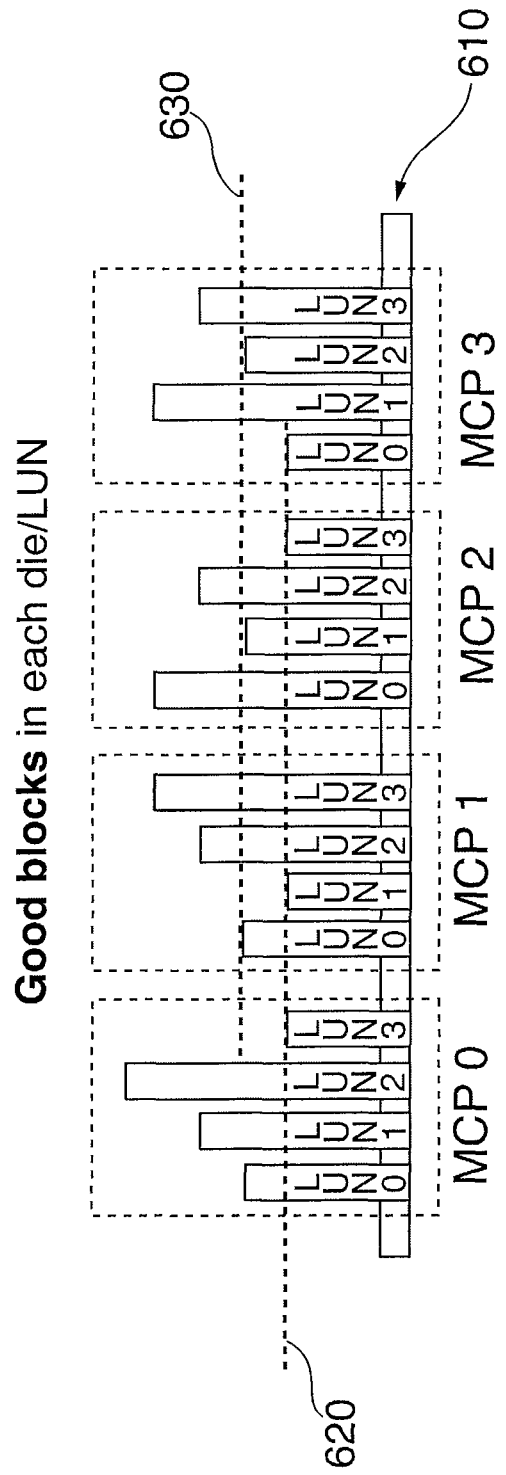
FIG. 6 is diagram of an embodiment showing how a metablock can be formed from blocks in a given memory die position across multi-chip packages.

Because of the presence of bad blocks and because a metablock is formed from good blocks, the number of metablocks formed on multiple multi-chip packages is determined by the distribution of good blocks across the dies. This is illustrated in FIG. 6. FIG. 6 shows four multi-chip packages (MCP0-MCP3), each with four LUNs (LUN0-LUN3). Item 610 shows a metablock stripe across MCP0-MCP3, where each instance of the storage management software running on the host controller would get metablocks from the dies in the same relative position in each multi-chip package. For example, Instance 0 of the storage management software would get metablocks from LUN0 on each of MCP0-MCP3, Instance 1 of the storage management software would get metablocks from LUN1 on each of MCP0-MCP3, etc. In this example, a simple ordered LUN mapping assigns LUN N from each of the four multi-chip packages to form metablock stripes for each of N software instances. That is, if one expects random ordering of the number of good blocks across physical die 0/LUN 0 to die n/LUN n, simple physical ordering of LUNs will likely produces fewer metablocks per LUN due to sub-optimal minimum good blocks grouping.

FIG. 6 also shows, diagrammatically, a typically-expected distribution of good blocks on each LUN (considering all planes) across four ONFI channels (MCP0-MCP3), where the height of each bar represents the number of good blocks on the LUN. Of course, it should be understood that the number of good/bad blocks are probably not all physically next to one another, so these bars are meant to indicate a total number of good blocks rather than a location of the good blocks. So, for example, in MCP0, LUN2 has the greatest number of good blocks, and LUN3 has the smallest number of good blocks.

In the embodiment where each instance of the storage management software running on the host controller would get metablocks from the dies in the same relative position in each multi-chip package, each instance of the software may have a different maximum number of metablocks that can be formed because different such LUNs may have different numbers of good blocks. Such maximum number would be determined by the LUN with the lowest number of good blocks. For example, as indicated by item 620 in FIG. 6, the maximum number of metablocks formed for Instance 0 of the software (the instance pulling blocks from LUN0 across MCP0-MCP3) is limited by the number of good blocks in LUN0 of MCP3, as that LUN has the lowest number of good blocks out of the LUN0's across MCP0-MCP3. Similarly, as indicated by item 630 in FIG. 6, the maximum number of metablocks formed for Instance 2 of the software (the instance pulling blocks from LUN2 across MCP0-MCP3) is limited by the number of good blocks in LUN2 of MCP3, as that LUN has the lowest number of good blocks out of the LUN2's across MCP0-MCP3. Instances 1 and 3 of the software would face similar restrictions.

Figure 7:
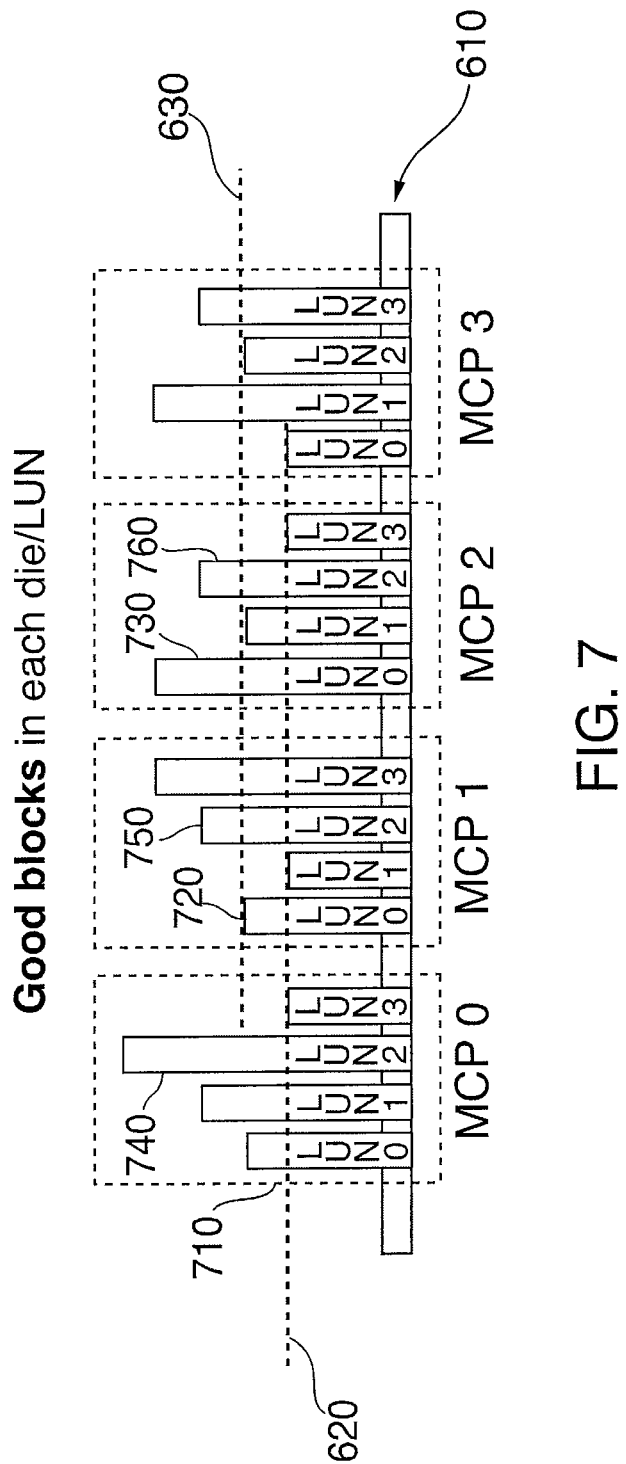
FIG. 7 is diagram of an embodiment showing a metablock created across several multi-chip packages of an embodiment.

So, in operation, the configuration software running on the host controller would "tally" the minimum number of good blocks per LUN(n) across all four multi-chip packages. The Min (LUN(n) good blocks across all multi-chip packages) are assigned to (n) metablocks of instance n of the storage management software. Good blocks above the LUN(n) minimum after the minimum number of metablocks are formed are not used or assigned but are instead considered leftover/extra blocks per die that are kept by the storage management software as spare blocks for future bad block remapping. However, this can lead to a significant number of blocks being kept as spares, which may not be the most efficient use of memory. For example, with reference to FIG. 7, the areas shown by items 710, 720, and 730 would be spare blocks, as they are over the threshold 620 set by LUN0 of MCP3 for instance 0. Likewise, the areas shown by items 740, 750, and 760 would be spare blocks, as they are over the threshold 630 set by LUN2 of MCP3 for Instance 2. Although not indicated in FIG. 6, Instances 1 and 3 also have under-utilized good blocks.

The following embodiments can be used to more optimally form metablocks to improve memory system performance. In general, the following embodiments can be used to determine the number of good blocks in each memory die and, based on that determination, select which memory dies to use to create a metablock. By forming a metablock based on a deliberate selection of memory dies rather than based on a predetermined selection that does not take into account the number of bad blocks, these embodiments can result in better performance. This provides an efficient die mapping method to enable the host controller to better utilize the available good blocks across all flash memory stacks and across ONFI channels. Such optimized block usage can provide both better performance and better product endurance. This embodiment now will be described in conjunction with the flow chart 800 shown in FIG. 8, which illustrates acts performed by the host controller.

Figure 8:
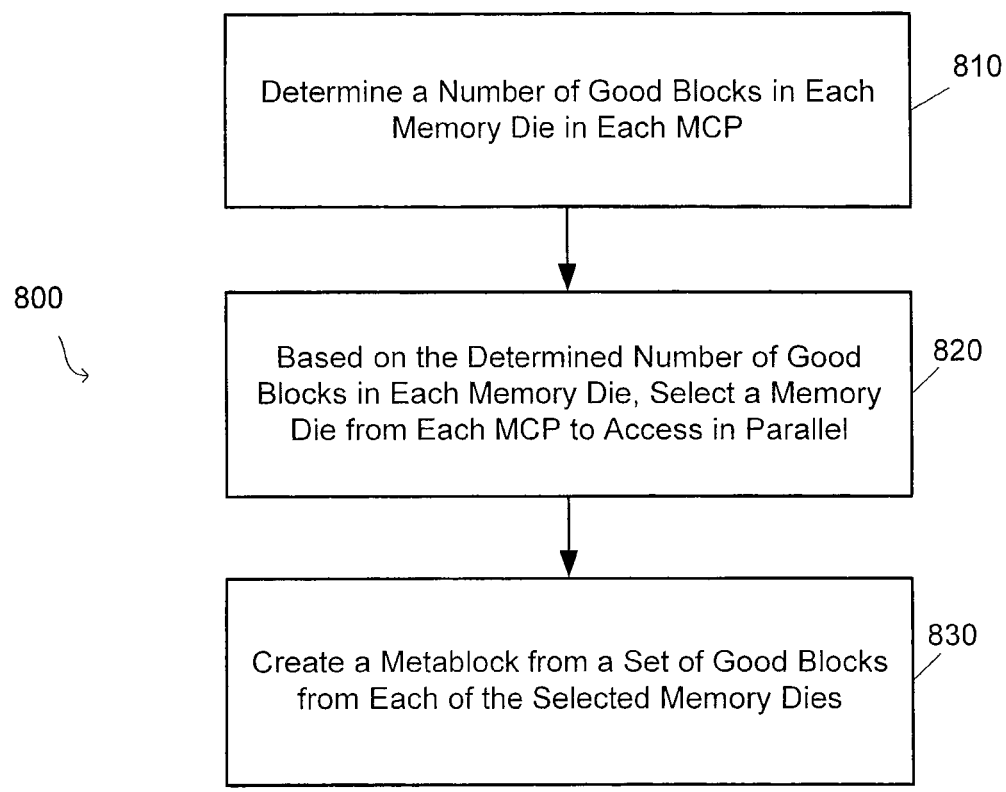
FIG. 8 is a flow chart of an embodiment for creating a metablock across multi-chip memory packages.

As shown in FIG. 8, the controller first determines the number of good blocks in each memory die in each of the multi-chip memory packages (act 810). The number of good blocks can be determined in any suitable manner. For example, each memory die can be tested at manufacturing by a tester, and the number of good (or bad) blocks can be stored in a register. In this case, the controller can determine the number of good blocks by reading the value out of the register. As another example, the first time the memory system boots up (or every time, or some other frequency of boot up), the controller can perform a self-test to determine the number of good blocks. Any suitable method can be used to test for good/bad blocks. For example, the method described in U.S. Pat. No. 7,171,536, which is assigned to SanDisk and which is hereby incorporated by reference, can be used. Of course, this is just one example, and other methods can be used.

Next, based on the determined number of good blocks in each memory die, the controller selects a memory die from each of the multi-chip memory packages to access in parallel (act 820). Significantly, unlike in the method discussed above, in this method, the selected memory dies are not necessarily all in the same relative position in each multi-chip package. This allows the controller to create a metablock from a set of good blocks from each of the selected memory dies to form the "best" metablock possible (act 830). This is illustrated in FIGS. 9 and 10.

Figure 9:
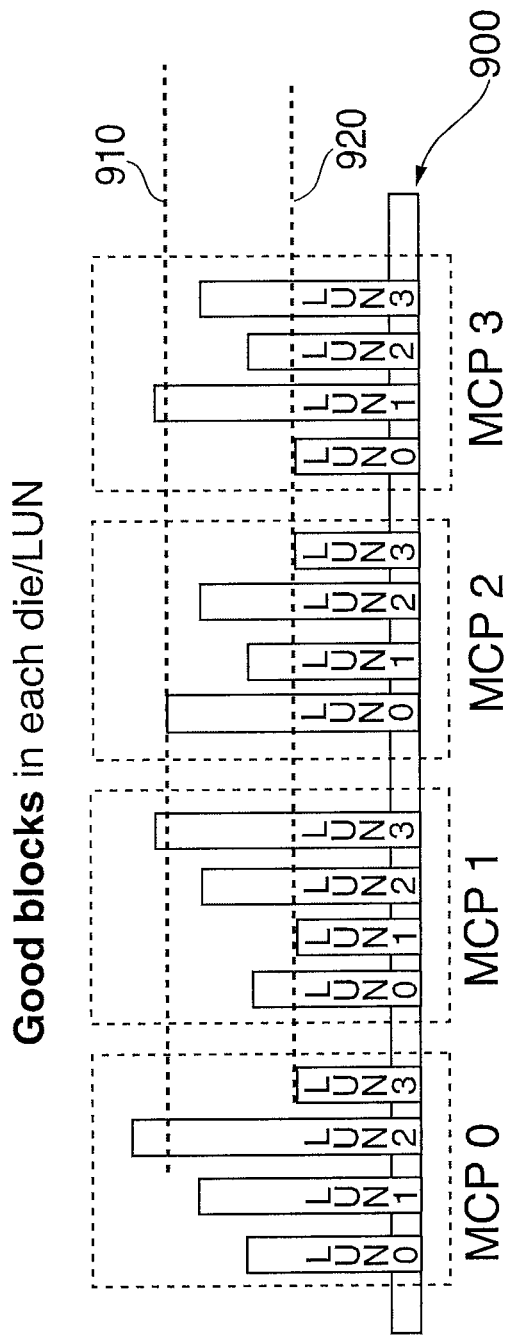
FIG. 9 is diagram of an embodiment showing a metablock created across several multi-chip packages of an embodiment.
Figure 10:
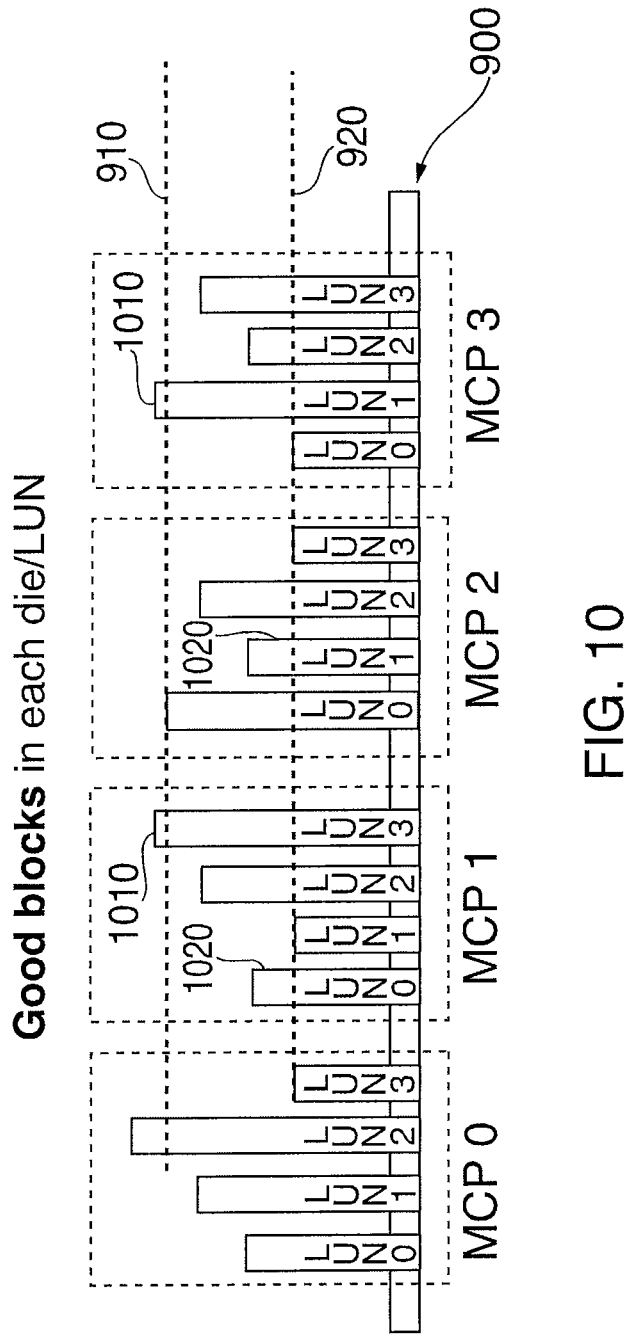
FIG. 10 is diagram of an embodiment showing a metablock created across several multi-chip packages of an embodiment.

FIG. 9 shows the four MCPs, as used in the prior example, with item 900 representing a metablock stripe for one instance of the storage device management software. However, unlike the prior examples, the memory dies that make up the metablock for a given instance do not necessarily need to all be in the same relative position in each multi-chip package. That is, instead of instance 0 of the storage management software using LUN0 on each of MCP0-MCP3, instance 0 can use different LUNs from different ones of the MCPs, and the selection of the dies can be based on any criteria. To do this, the controller can "tally" the minimum number of good blocks per LUN/plane across all MCPs and rank them in any suitable manner (e.g., from most good blocks to least). For example, as shown in FIG. 9, the host controller can decide to form a metablock using the group of dies that have the greatest number of good blocks (item 910) as the "best slice" and the group of dies that has the lowest number of good blocks (item 920) as the "worst slice." As shown in FIG. 10, the "best slice" results in the greatest number of good blocks to form metablocks, while the "worst slice" results in the fewest formed metablocks. (As in the prior example, the unused blocks can be used as spare blocks for bad block remapping.) As can be seen from this example, this embodiment allows metablocks to be created to maximize the total number of metablocks per slice of LUNs, which can reduce the amount of good blocks that are "wasted" or under-utilized, thereby increasing performance of the memory system.

Many alternatives can be used with these embodiments. For example, instead of selecting memory dies to create the "best" or "worst" slice, the controller can select the memory dies to instead uniformly spread good blocks across all the instances. Also, because the metablock slices are created more intelligently with these embodiments, the controller can prioritize traffic to a given slice based on service level (e.g., performance response time) or traffic type (e.g., user data vs. control data vs. operating system data vs. log files, etc.).

In summary, these embodiments can be used to provides a way to optimize the utilization of available good blocks across all NAND dies in the memory system. The formation of metablocks is improved by virtualizing the LUN-to-metablock mapping across the MCP/ONFI channels. Instead of using a simple ordered LUN mapping, all die/LUNs in each MCP are considered when forming a metablock slice across MCPs/ONFI channels, and, with this improved grouping, more metablocks can likely be formed to more uniformly spread good blocks across all the instances or formed in rank of "best" to "worst," for example. Thus, the "virtual LUN assignment across ONFI channels in these embodiments enables better utilization of good blocks, produces sorted, better matched number of good blocks per die, and enables the formation of more metablocks on some LUNs, which can result in better performance.

CONCLUSION

It is intended that the foregoing detailed description be understood as an illustration of selected forms that the invention can take and not as a definition of the invention. It is only the following claims, including all equivalents that are intended to define the scope of this invention. Also, some of the following claims may state that a component is operative to perform a certain function or configured for a certain task. It should be noted that these are not restrictive limitations. It should also be noted that the acts recited in the claims can be performed in any order—not necessarily in the order in which they are recited.

What is claimed is:

1. A controller comprising:
   one or more interfaces through which to communicate with a plurality of multi-chip memory packages, wherein each multi-chip memory package comprises a plurality of memory dies, and wherein each memory die has a respective plurality of memory blocks, some of which are good blocks and some of which are bad blocks; and
   a processor in communication with the one or more interfaces, wherein the processor is configured to:
      determine a number of good blocks in each memory die in each of the multi-chip memory packages;
      based on the determined number of good blocks in each memory die, select a memory die from each of the multi-chip memory packages to access in parallel, wherein the selected memory dies are not necessarily all in the same relative position in each multi-chip package; and
      create a metablock from a set of good blocks from each of the selected memory dies, wherein a maximum number of metablocks that can be created across the selected memory dies is determined by a lowest number of good blocks in the selected memory dies.

2. The controller of claim 1, wherein the selecting and creating acts are performed for N instances of storage management software running on the controller, wherein N is the number of memory dies on each multi-chip package, and wherein different memory dies are selected in each instance.

3. The controller of claim 2, wherein the memory dies are selected to uniformly spread good blocks across all the instances.

4. The controller of claim 2, wherein the memory dies are selected to allocated the greatest number of good blocks together in a single instance.

5. The controller of claim 2, wherein the processor is further configured to prioritize traffic to the instances according to a service level.

6. The controller of claim 2, wherein the processor is further configured to prioritize traffic to the instances according to a traffic type.

7. The controller of claim 1, wherein the controller is part of a solid-state drive.

8. The controller of claim 1, wherein the controller is in communication with each multi-chip memory package using a different Open NAND Flash Interface (ONFI) channel.

9. The controller of claim 8, wherein each ONFI channel supports a plurality of multi-chip memory packages.

10. The controller of claim 1, wherein good blocks that are not allocated to a metablock are reserved as spare blocks for bad block remapping.

11. A method for creating a metablock across multi-chip memory packages, the method comprising:
    performing in a controller comprising one or more interfaces through which to communicate with a plurality of multi-chip memory packages, wherein each multi-chip memory package comprises a plurality of memory dies, and wherein each memory die has a respective plurality of memory blocks, some of which are good blocks and some of which are bad blocks:
       determine a number of good blocks in each memory die in each of the multi-chip memory packages;
       based on the determined number of good blocks in each memory die, select a memory die from each of the multi-chip memory packages to access in parallel, wherein the selected memory dies are not necessarily all in the same relative position in each multi-chip package; and
       create a metablock from a set of good blocks from each of the selected memory dies, wherein a maximum number of metablocks that can be created across the selected memory dies is determined by a lowest number of good blocks in the selected memory dies.

12. The method of claim 11, wherein the selecting and creating acts are performed for N instances of storage management software running on the controller, wherein N is the number of memory dies on each multi-chip package, and wherein different memory dies are selected in each instance.

13. The method of claim 12, wherein the memory dies are selected to uniformly spread good blocks across all the instances.

14. The method of claim 12, wherein the memory dies are selected to allocated the greatest number of good blocks together in a single instance.

15. The method of claim 12 further comprising prioritizing traffic to the instances according to a service level.

16. The method of claim 12 further comprising prioritizing traffic to the instances according to a traffic type.

17. The method of claim 11, wherein the controller is part of a solid-state drive.

18. The method of claim 11, wherein the controller is in communication with each multi-chip memory package using a different Open NAND Flash Interface (ONFI) channel.

19. The method of claim 18, wherein each ONFI channel supports a plurality of multi-chip memory packages.

20. The method of claim 11, wherein good blocks that are not allocated to a metablock are reserved as spare blocks for bad block remapping.

* * * * *

UNITED STATES PATENT AND TRADEMARK OFFICE
CERTIFICATE OF CORRECTION

| | | |
|---|---|---|
| PATENT NO. | : 8,700,961 B2 | |
| APPLICATION NO. | : 13/330975 | |
| DATED | : April 15, 2014 | |
| INVENTOR(S) | : Paul A. Lassa et al. | |

It is certified that error appears in the above-identified patent and that said Letters Patent is hereby corrected as shown below:

<u>In the Claims</u>

In column 9, claim 1, line 67, after "multi-chip memory packages" delete "to access in parallel".

In column 10, claim 11, line 51, after "multi-chip memory packages" delete "to access in parallel".

Signed and Sealed this
Twelfth Day of August, 2014

Michelle K. Lee
*Deputy Director of the United States Patent and Trademark Office*